(12) United States Patent
Hwang et al.

(10) Patent No.: US 11,615,856 B2
(45) Date of Patent: Mar. 28, 2023

(54) MEMORY DEVICE AND METHOD OF PERFORMING PROGRAM OPERATION

(71) Applicant: SK hynix Inc., Gyeonggi-do (KR)

(72) Inventors: Sung Hyun Hwang, Gyeonggi-do (KR); Jae Yeop Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/378,206

(22) Filed: Jul. 16, 2021

(65) Prior Publication Data
US 2022/0254421 A1    Aug. 11, 2022

(30) Foreign Application Priority Data

Feb. 5, 2021 (KR) ........................ 10-2021-0016989

(51) Int. Cl.
| | | |
|---|---|---|
| *G11C 16/04* | (2006.01) | |
| *G11C 16/34* | (2006.01) | |
| *G11C 16/24* | (2006.01) | |
| *G11C 16/08* | (2006.01) | |
| *G11C 16/10* | (2006.01) | |

(52) U.S. Cl.
CPC ...... *G11C 16/3459* (2013.01); *G11C 16/0483* (2013.01); *G11C 16/08* (2013.01); *G11C 16/10* (2013.01); *G11C 16/24* (2013.01)

(58) Field of Classification Search
CPC . G11C 16/3459; G11C 16/0483; G11C 16/08; G11C 16/10; G11C 16/24
USPC ................................................. 365/185.11
See application file for complete search history.

(56) References Cited

U.S. PATENT DOCUMENTS

| 9,721,672 B1* | 8/2017 | Dutta ................. G11C 16/0483 |
| 2014/0340964 A1* | 11/2014 | Shiino ................. G11C 11/5628 |
| | | 365/185.03 |
| 2019/0392894 A1* | 12/2019 | Zhao ..................... G11C 16/30 |

FOREIGN PATENT DOCUMENTS

| KR | 10-2015-0110917 A | 10/2015 |
| KR | 10-2017-0059643 A | 5/2017 |

* cited by examiner

*Primary Examiner* — Tha-O H Bui
(74) *Attorney, Agent, or Firm* — IP & T Group LLP

(57) ABSTRACT

A memory device having an improved operation speed may include a memory block including memory cells, a peripheral circuit configured to perform a program operation of increasing each of threshold voltages of the memory cells, and a control logic configured to control the peripheral circuit to perform the program operation. The program operation may include a plurality of program loops, each of the plurality of program loops may include a program voltage apply operation and a verify operation, and the control logic may control the peripheral circuit to perform verification on a highest program state during a verify operation included in a next program loop of any one program loop, when verification of a next higher program state among the plurality of program states is passed during a verify operation included in the any one program loop among the plurality of program loops.

20 Claims, 16 Drawing Sheets

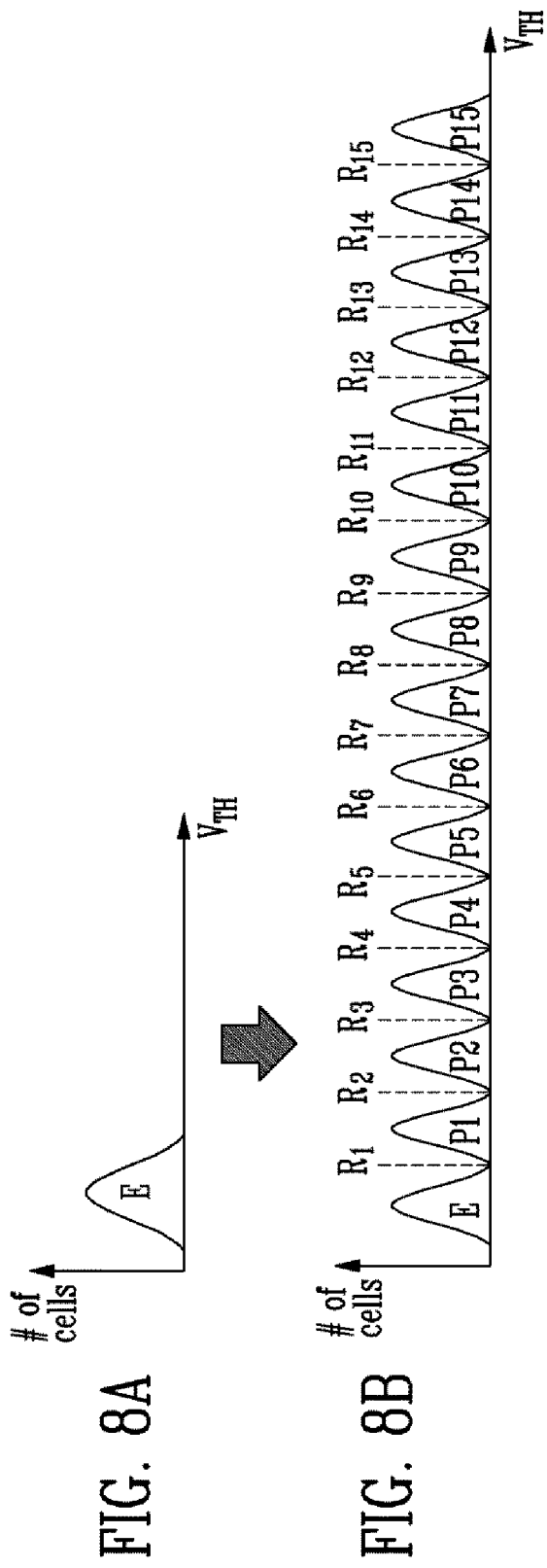

FIG. 9A

| | ...14 | 15 | 16 | 17 | 18 | 19 | 20 | 21 |
|---|---|---|---|---|---|---|---|---|
| PV6 | 0 | 0 | 0 | 0 | 0 | 0 | | |
| PV7 | | | 0 | 0 | 0 | 0 | 0 | 0 |

FIG. 9B

| | ...14 | 15 | 16 | 17 | 18 | 19 | 20 | 21 |
|---|---|---|---|---|---|---|---|---|
| PV6 | 0 | 0 | 0 | 0 | 0 | 0 | 0 | 0 |
| PV7 | | | | | | | | |

MEMORY DEVICE AND METHOD OF PERFORMING PROGRAM OPERATION

CROSS-REFERENCE TO RELATED APPLICATION

The present application claims priority under 35 U.S.C. § 119(a) to Korean patent application number 10-2021-0016989 filed on Feb. 5, 2021, in the Korean Intellectual Property Office, the entire disclosure of which is incorporated by reference herein.

BACKGROUND

Field of Invention

The present disclosure relates to an electronic device, and more particularly, to a memory device and a method of operating the same.

Description of Related Art

A storage device is a device that stores data under control of a host device such as a computer or a smartphone. The storage device may include a memory device storing data and a memory controller controlling the memory device. The memory device may be classified into a volatile memory device and a nonvolatile memory device.

The volatile memory device may be a device that stores data only when power is supplied and loses the stored data when the power supply is cut off. The volatile memory device may include a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory device having improved reliability and operation speed, and a method of operating the same.

A memory device according to one embodiment of the present disclosure may include a memory block including memory cells, a peripheral circuit configured to perform a program operation of increasing threshold voltages of the memory cells so that the threshold voltages of the memory cells are included in a threshold voltage distribution corresponding to target program states determined according to data to be stored in the memory cells among a plurality of program states, and a control logic configured to control the peripheral circuit to perform the program operation. The program operation may include a plurality of program loops, the plurality of program loops may include a program voltage apply operation and a verify operation, and the control logic may control the peripheral circuit to perform verification on a highest program state during a verify operation included in a next program loop of any one program loop among the plurality of program loops when verification on a second highest program state among the plurality of program states is determined as passed during a verify operation included in the any one program loop.

A memory device according to one embodiment of the present disclosure may include a memory block including memory cells, a peripheral circuit configured to perform a program operation of increasing threshold voltages of the memory cells so that the threshold voltages of the memory cells are included in a threshold voltage distribution corresponding to target program states determined according to data to be stored in the memory cells among a plurality of program states, and a control logic configured to control the peripheral circuit to apply a program control voltage to bit lines of memory cells having a highest program state as a target program state among the plurality of program states while applying a program voltage corresponding to a second highest program state among the plurality of program states to a word line to which the memory cells are commonly connected during the program operation.

A memory device that performs a program operation of storing data in memory cells each having any one state among first to N-th program states as a target program state according to one embodiment of the present disclosure may include a memory block including the memory cells, a peripheral circuit configured to perform the program operation including a plurality of program loops each including a program voltage apply operation and a verify operation, and a control logic configured to control the peripheral circuit to perform the program operation. The control logic may perform verification on the N-th program state during a verify operation included in an (n+1)-th program loop among the plurality of program loops when verification on an (N−1)-th program state is passed during a verify operation included in an n-th program loop among the plurality of program loops, and apply a program control voltage to a bit line of a memory cell having the N-th program state as a target program state while applying a program voltage corresponding to the (N−1)-th program state to a word line to which the memory cells are commonly connected during a program voltage apply operation included in the n-th program loop.

An operating method of a memory device having a word line coupled to memory cells coupled to respective bit lines, the operating method comprising applying, during a current program loop, a control voltage to the bit line coupled to a first cell while applying to the word line a program voltage corresponding to a second state and beginning verifying the first cell for a first state during a subsequent program loop when one or more second cells are verify-passed for the second state during the current program loop. The first and second states are sequentially highest two of states to which the memory cells are to be programmed. The first cell is to be programmed to the first state among the memory cells. The second cells are to be programmed to the second state among the memory cells.

According to the present technology, a memory device having improved reliability and operation speed may be provided.

BRIEF DESCRIPTION OF THE DRAWINGS

FIGS. 8A and 8B are diagrams illustrating a threshold voltage distribution of a quad level cell.

FIG. 9A is a table showing a program state verified in a plurality of program loops according to a comparative embodiment of the present disclosure.

FIG. 9B is a table showing a program state verified in a plurality of program loops according to an embodiment of the present disclosure.

DETAILED DESCRIPTION

Structural or functional descriptions of embodiments according to the concept which are disclosed in the present application are illustrated only to describe the embodiments. The embodiments may be carried out in various forms and should not be construed as being limited to the embodiments described in the present application.

Figure 1:
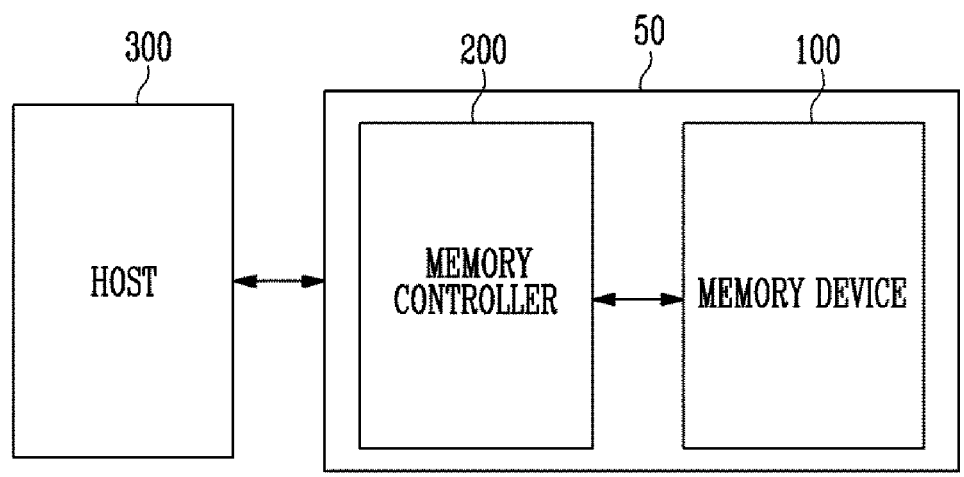
FIG. 1 is a diagram illustrating a storage device including a memory device according to an embodiment of the present disclosure.

FIG. 1 is a diagram illustrating a storage device including a memory device according to one embodiment of the present disclosure.

Referring to FIG. 1, the storage device 50 may include a memory device 100 and a memory controller 200 that controls an operation of the memory device. The storage device 50 may be a device that stores data under control of a host 300 such as for example a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as for example an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as for example a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data.

The memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array may include a plurality of memory blocks. The memory block may include a plurality of memory cells. One memory block may include a plurality of pages. In one embodiment, the page may be a unit for storing data in the memory device 100 or reading data stored in the memory device 100. The memory block may be a unit for erasing data.

In one embodiment, the memory device 100 may be for example a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, it is assumed that the memory device 100 is a NAND flash memory.

The memory device 100 is configured to receive a command CMD and an address ADDR from the memory controller 200 and access an area selected by the address ADDR in the memory cell array. The memory device 100 may perform an operation instructed by the command CMD on the area selected by the address. For example, the memory device 100 may perform a program operation, a read operation, and an erase operation. During the program operation, the memory device 100 may store data in the area selected by the address ADDR. During the read operation, the memory device 100 may read data from the area selected by the address ADDR. During the erase operation, the memory device 100 may erase data stored in the area selected by the address ADDR.

In one embodiment, the memory device 100 may include a plurality of planes. The plane may be a unit capable of independently performing an operation. For example, the memory device 100 may include two, four, or eight planes. The plurality of planes may independently perform each of the program operation, the read operation, or the erase operation, simultaneously.

The memory controller 200 may control an overall operation of the storage device 50.

When power is applied to the storage device 50, the memory controller 200 may execute firmware (FW). When the memory device 100 is a flash memory device, the firmware (FW) may include a host interface layer (HIL) that controls communication with the host 300. The memory controller may include a flash translation layer (FTL) that controls communication between the host 300 and the memory device 100, and a flash interface layer (FIL) that controls communication with the memory device 100.

The memory controller 200 may receive write data and a logical block address (LBA) from the host 300 and may convert the LBA into a physical block address (PBA) indicating an address of memory cells included in the memory device 100 in which data is to be stored. In one embodiment, the LBA and a "logic address" or a "logical address" may be used as the same meaning. In one embodiment, the PBA and a "physical address" may be used as the same meaning.

The memory controller 200 may control the memory device 100 to perform the program operation, the read operation, the erase operation, or the like according to a request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In one embodiment, the memory controller 200 may generate a command, an address, and data independently regardless of the request from the host 300 and transmit the command, the address, and the data to the memory device 100. For example, the memory controller 200 may provide the command, the address, and the data for performing a read operation and program operations accompanying in performing wear leveling, read reclaim, garbage collection, and the like, to the memory device 100.

In one embodiment, the memory controller 200 may control two or more memory devices 100. In this case, the memory controller 200 may control the memory devices 100 according to an interleaving method to improve operation performance. The interleaving method may be a method of controlling operations for at least two memory devices 100 to overlap with each other. Alternatively, the interleaving method may be a method in which two or more memory devices 100 operate in parallel.

The buffer memory may temporarily store data provided from the host 300, that is, data to be stored in the memory device 100, or may temporarily store data read from the memory device 100. In an embodiment, the buffer memory may be a volatile memory device. For example, the buffer memory may be for example a dynamic random access memory (DRAM) or a static random access memory (SRAM).

The host 300 may communicate with the storage device 50 using at least one of various communication methods such as for example a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
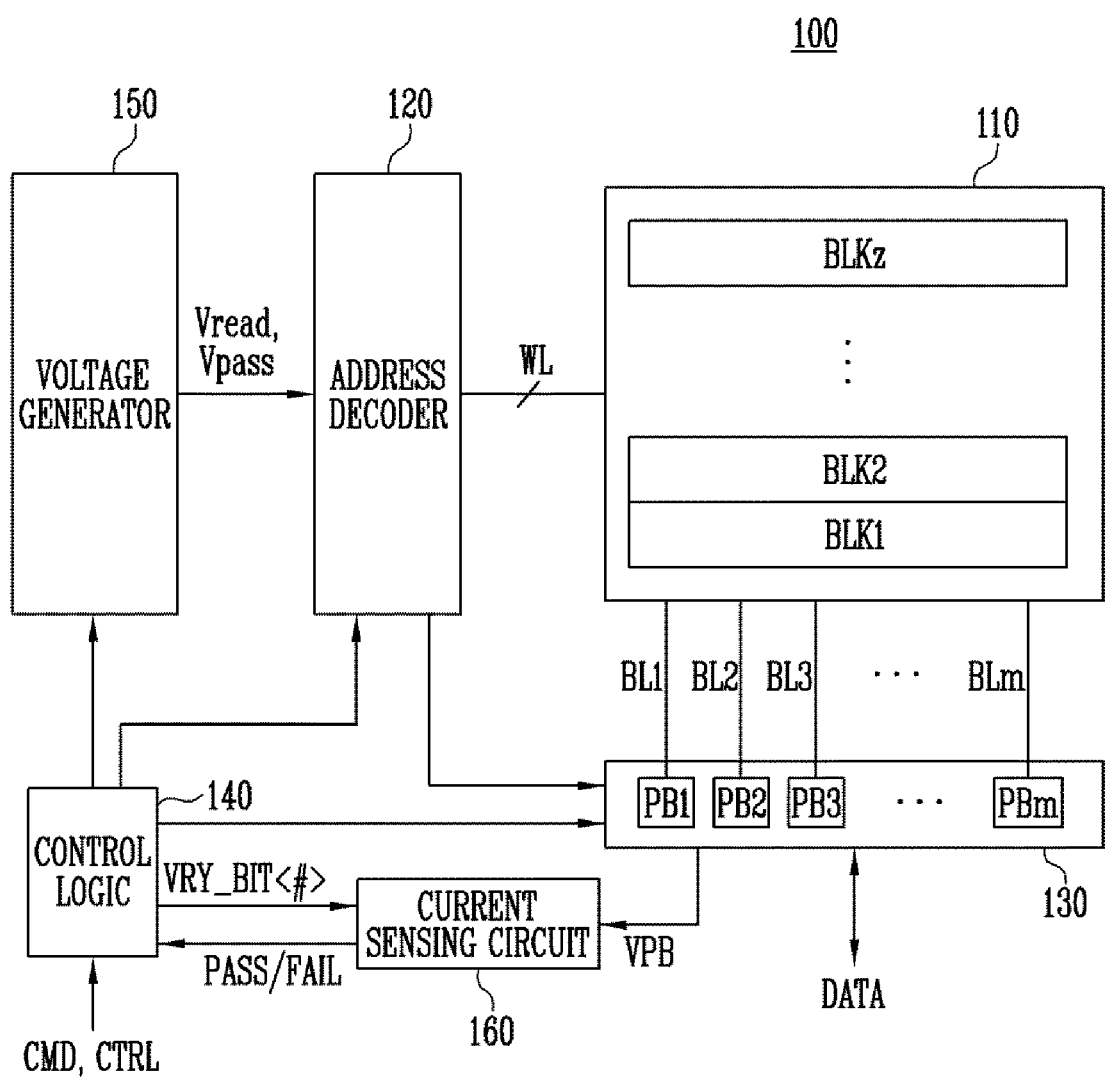
FIG. 2 is a diagram illustrating the memory device of FIG. 1.

FIG. 2 is a diagram illustrating the memory device of FIG. 1.

Referring to FIG. 2, the memory device 100 includes a memory cell array 110, an address decoder 120, a read and write circuit 130, a control logic 140, a voltage generator 150, and a current sensing circuit 160. The address decoder 120, the read and write circuit 130, the voltage generator 150, and the current sensing circuit 160 defines a peripheral circuit controlled by the control logic 140.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. The plurality of memory blocks BLK1 to BLKz includes a plurality of memory cells. In one embodiment, the plurality of memory cells are non-volatile memory cells, and may be configured of non-volatile memory cells having a vertical channel structure. The memory cell array 110 may be configured as a memory cell array of a two-dimensional structure. According to one embodiment, the memory cell array 110 may be configured as a memory cell array of a three-dimensional structure. Meanwhile, each of the plurality of memory cells included in the memory cell array may store at least one bit of data. In one embodiment, each of the plurality of memory cells included in the memory cell array 110 may be an SLC storing one bit of data. In another embodiment, each of the plurality of memory cells included in the memory cell array 110 may be an MLC storing two bits of data. In still another embodiment, the plurality of memory cells included in the memory cell array 110 may be a TLC storing three bits of data. In still another embodiment, the plurality of memory cells included in the memory cell array 110 may be a QLC storing four bits of data. According to one embodiment, the memory cell array 110 may include a plurality of memory cells each storing five or more bits of data.

The address decoder 120 is connected to the memory cell array 110 through the word lines WL. The address decoder 120 is configured to operate in response to control of the control logic 140. The address decoder 120 receives an address through an input/output buffer inside the memory device 100.

The address decoder 120 is configured to decode a block address among the received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 may be configured to decode a column address of the received addresses. The address decoder 120 transmits the decoded column address to the read and write circuit 130.

The read operation and the program operation of the memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as a "physical page".

The read and write circuit 130 includes a plurality of page buffers PB1 to PBm. The read and write circuit 130 may operate as a "read circuit" during the read operation of the memory cell array 110 and may operate as a "write circuit" during the write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change as sensing data. The read and write circuit 130 operates in response to page buffer control signals output from the control logic 140. In one embodiment, the write operation of the write circuit may be used as the same meaning as the program operation on selected memory cells.

During the read operation, the read and write circuit 130 senses data of the memory cell, temporarily stores read data, and outputs data DATA to the input/output buffer (not shown) of the memory device 100. In one embodiment, the read and write circuit 130 may include a column select circuit, and the like, in addition to the page buffers (or page registers). The read and write circuit 130 may be a page buffer according to an embodiment of the present disclosure.

The control logic 140 is connected to the address decoder 120, the read and write circuit 130, the voltage generator 150, and the current sensing circuit 160. The control logic 140 receives a command CMD and a control signal CTRL through the input/output buffer of the memory device 100. The control logic 140 is configured to control overall operations of the memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The control logic 140 may determine whether a verify operation on a specific target program state is passed or failed in response to a pass signal PASS or a fail signal FAIL received from the current sensing circuit 160.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The current sensing circuit 160 may generate a reference current and a reference voltage in response to a permission bit VRY_BIT<#> received from the control logic 140 during a verify operation. A pass signal PASS or a fail signal FAIL may be output by comparing the generated reference voltage with a sensing voltage VPB received from the page buffers PB1 to PBm included in the read and write circuit 130 or comparing the generated reference current with a sensing current received from the page buffers PB1 to PBm included in the read and write circuit 130.

The address decoder 120, the read and write circuit 130, the voltage generator 150, and the current sensing circuit 160 may function as the "peripheral circuit" that performs the read, write, and erase operations on the memory cell array 110. The peripheral circuit performs the read, the write, and erase operations on the memory cell array 110 based on the control of the control logic 140.

Figure 3:
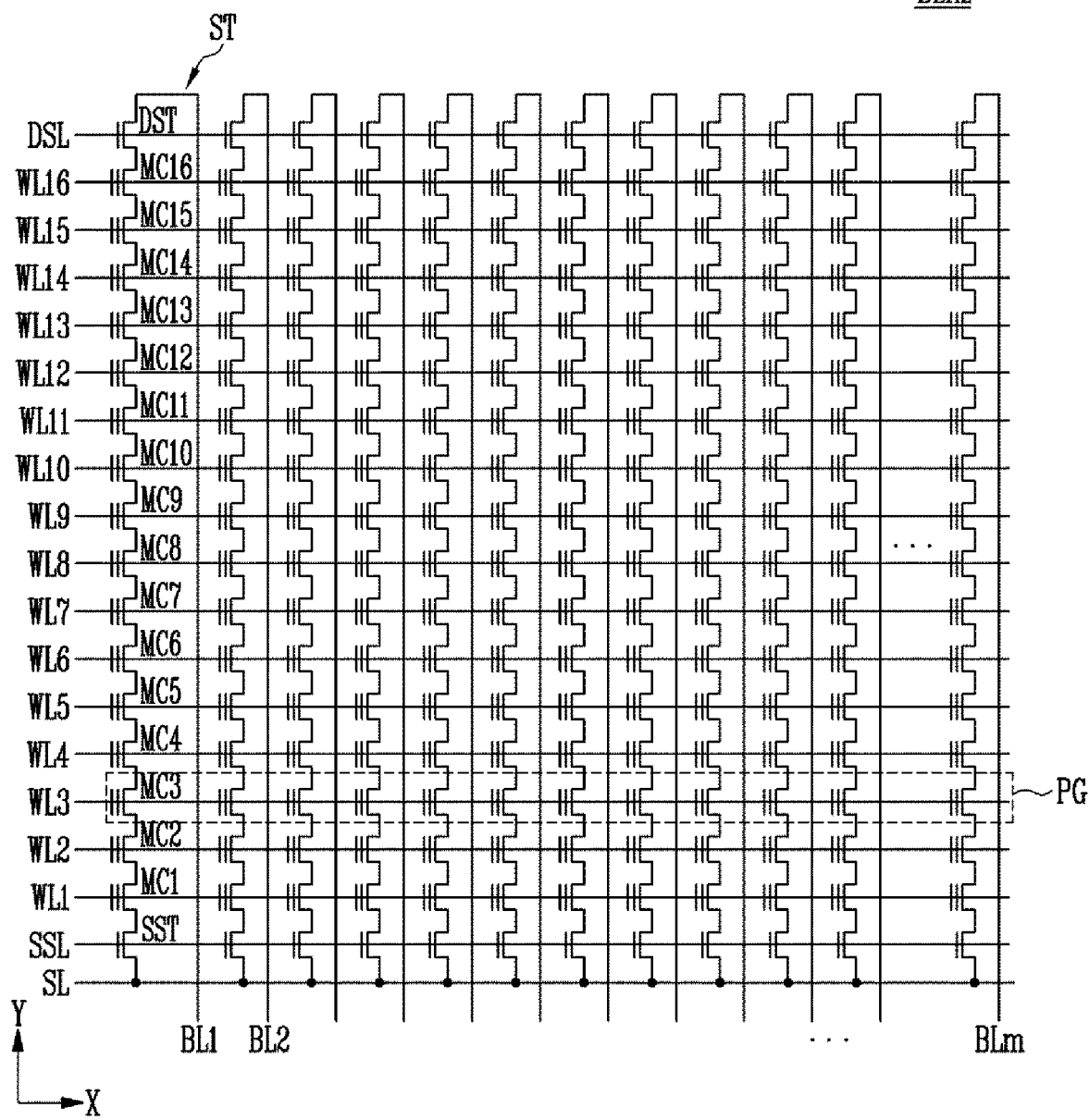
FIG. 3 is a diagram illustrating a configuration of any one of memory blocks of FIG. 2.

FIG. 3 is a diagram illustrating a configuration of any one of the memory blocks of FIG. 2.

The memory block BLKz is any one memory block BLKz among the memory blocks BLK1 to BLKz of FIG. 2.

Referring to FIG. 3, a plurality of word lines arranged in parallel with each other may be connected between a first select line and a second select line. In this embodiment, the first select line may be the source select line SSL, and the second select line may be the drain select line DSL. More specifically, the memory block 110 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 is specifically described, as an example.

The string ST may include a source select transistor SST, a plurality of memory cells MC1 to MC16, and a drain select transistor DST connected in series between the source line SL and the first bit line BL1. One string ST may include at least one of the source select transistor SST and the drain select transistor DST, and may include the memory cells more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16, respectively. A group of the memory cells connected to the same word line among the memory cells included in different strings ST may define one page PG. Therefore, the memory block BLKz may include the pages PG of the number of the word lines WL1 to WL16.

One memory cell SLC may store one bit of data. In this embodiment, one physical page PG may store one logical page (LPG) data. The one logical page (LPG) data may include data bits of the same number as cells included in one physical page PG.

The one memory cell may store two or more bits of data. In this embodiment, one physical page PG may store two or more logical page (LPG) data.

Figure 4:
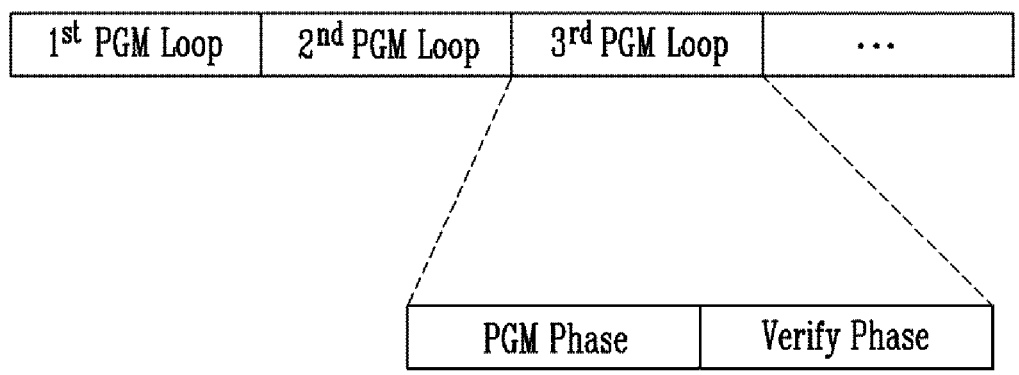
FIG. 4 is a diagram illustrating a plurality of program loops included in a program operation, and a program voltage apply operation and a verify operation included in each program loop.

FIG. 4 is a diagram illustrating a plurality of program loops included in a program operation, and a program voltage apply operation and a verify operation included in one or more program loops.

Referring to FIG. 4, the program operation may include the plurality of program loops. As shown in FIG. 4, the program operation may be started by performing a first program loop 1st PGM Loop. When the program operation on the selected memory cells is not completed even though the first program loop 1st PGM Loop is performed, a second program loop 2nd PGM Loop may be performed. When the program operation on the selected memory cells is not completed even though the second program loop $2^{nd}$ PGM Loop is performed, a third program loop 3rd PGM Loop may be performed. In this embodiment, the program loops may be repeatedly performed until the program operation is completed.

When the program operation is not completed even though the program loop is repeated up to a predetermined maximum number of program loops, it may be determined that the program operation is failed.

Figure 5A:
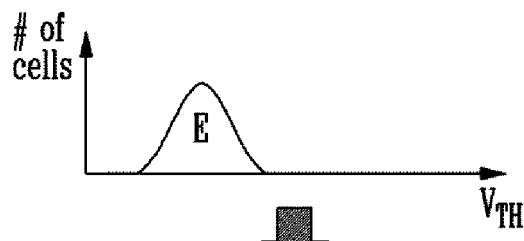
FIGS. 5A and 5B are diagrams illustrating a threshold voltage distribution of a single level cell.
Figure 5B:
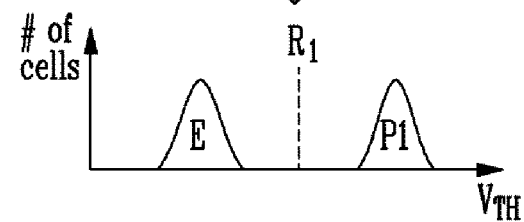

FIGS. 5A and 5B are diagrams illustrating a threshold voltage distribution of an SLC.

Referring to FIGS. 5A and 5B, a horizontal axis indicates a threshold voltage of a memory cell, and a vertical axis indicates the number of memory cells.

The memory device may perform the program operation in a word line unit. A plurality of memory cells connected to one word line may configure one physical page. The physical page may be a unit of the program operation or the read operation.

The memory device may perform the program operation to store data in memory cells connected to a selected word line among a plurality of word lines.

Selected memory cells, which are memory cells connected to the selected word line, may have a threshold voltage distribution corresponding to an erase state E as shown in FIG. 5A before the program operation is performed.

When the memory cell stores data corresponds to one bit, the memory cell may be programmed to have a threshold voltage corresponding to any one of the erase state E or a first program state P1.

The erase state E may correspond to data '1', and the first program state P1 may correspond to data '0'. However, the data corresponding to the first program state P1 is exemplary, and the erase state E may correspond to data '0', and the first program state P1 may correspond to data '1'.

When the program operation is ended, the selected memory cells may have the threshold voltage corresponding to any one of the erase state E or the first program state P1 as shown in FIG. 5B. The memory device may read data stored in the selected memory cells by performing a read operation using a first read voltage R1 between the erase state E and the first program state P1.

Figure 6A:
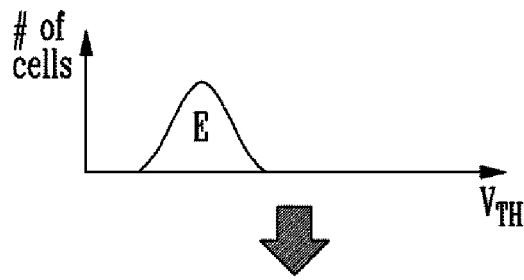
FIGS. 6A and 6B are diagrams illustrating a threshold voltage distribution of a multi-level cell.
Figure 6B:
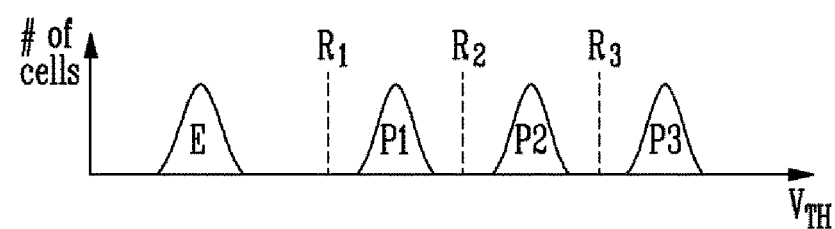

FIGS. 6A and 6B are diagrams illustrating a threshold voltage distribution of an MLC.

Referring to FIGS. 6A and 6B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 6A before the program operation is performed.

When the memory cell stores data corresponding to two bits, the memory cell may be programmed to have a threshold voltage corresponding to any one of the erase state E, a first program state P1, a second program state P2, and a third program state P3.

The erase state E may correspond to data '11', the first program state P1 may correspond to data '10', the second program state P2 may correspond to data '00', and the third program state P3 may correspond to data '01'. However, the data corresponding to each program state is exemplary and may be modified.

When the program operation is ended, the selected memory cells may have the threshold voltage corresponding to any one of the erase state E, the first program state P1, the second program state P2, and the third program state P3 as shown in FIG. 6B. The memory device may read data stored in the selected memory cells by performing a read operation using first to third read voltages R1 to R3.

The first read voltage R1 may be a read voltage that distinguishes between the erase state E and the first program state P1, the second read voltage R2 may be a read voltage that distinguishes between the first program state P1 and the second program state P2, and the third read voltage R3 may be a read voltage that distinguishes the second program state P2 and the third program state P3.

Figure 7A:
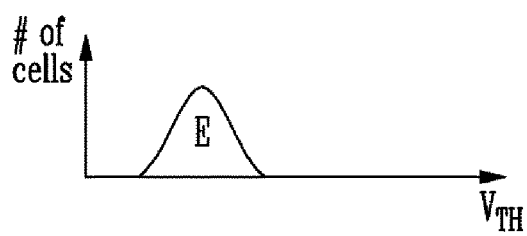
FIGS. 7A and 7B are diagrams illustrating a threshold voltage distribution of a triple level cell.
Figure 7B:
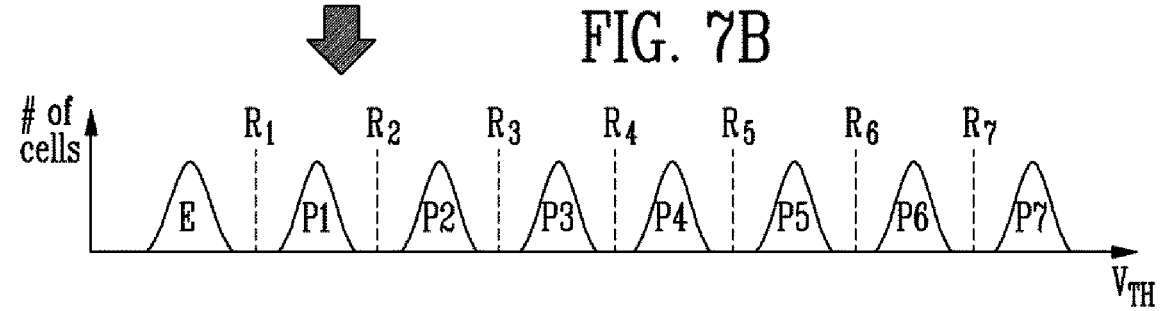

FIGS. 7A and 7B are diagrams illustrating a threshold voltage distribution of a TLC.

Referring to FIGS. 7A and 7B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 7A before the program operation is performed.

When the memory cell stores three bits of data, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7.

The erase state E may correspond to data '111', the first program state P1 may correspond to data '110', the second program state P2 may correspond to data '101', the third program state P3 may correspond to data '100', the fourth program state P4 may correspond to data '011', the fifth program state P5 may correspond to data '010', the sixth program state P6 may correspond to data '001', and the seventh program state P7 may correspond to data '000'. However, the data corresponding to each program state is exemplary and may be modified.

When the program operation is ended, the selected memory cells may have the threshold voltage corresponding to any one of the erase state E, the first program state P1, the second program state P2, the third program state P3, the fourth program state P4, the fifth program state P5, the sixth program state P6, and the seventh program state P7, as shown in FIG. 7B. The memory device may read data stored in the selected memory cells by performing a read operation using first to seventh read voltages R1 to R7.

The first read voltage R1 may be a read voltage that distinguishes between the erase state E and the first program state P1, the second read voltage R2 may be a read voltage that distinguishes between the first program state P1 and the second program state P2, the third read voltage R3 may be a read voltage that distinguishes between the second program state P2 and the third program state P3, the fourth read voltage R4 may be a read voltage that distinguishes between the third program state P3 and the fourth program state P4, the fifth read voltage R5 may be a read voltage that distinguishes between the fourth program state P4 and the fifth program state P5, the sixth read voltage R6 may be a read voltage that distinguishes between the fifth program state P5 and the sixth program state P6, and the seventh read voltage R7 may be a read voltage that distinguishes between the sixth program state P6 and the seventh program state P7.

FIGS. 8A and 8B are diagrams illustrating a threshold voltage distribution of a QLC.

Referring to FIGS. 8A and 8B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 8A before the program operation is performed.

When the memory cell stores data corresponding to four bits, the memory cell may be programmed to have a threshold voltage corresponding to any one of the erase state E and first to fifth program states P1 to P15.

The erase state E may correspond to data '1111', the first program state P1 may correspond to data '1110', the second program state P2 may correspond to data '1101', the third program state P3 may correspond to data '1100', the fourth program state P4 may correspond to data '1011', the fifth program state P5 may correspond to data '1010', the sixth program state P6 may correspond to data '1001', the seventh program state P7 may correspond to data '1000'. In addition, the eighth program state P8 may correspond to data '0111', the ninth program state P9 may correspond to data '0110', the tenth program state P10 may correspond to data '0101', the eleventh program state P11 may correspond to data '0100', the twelfth program state P12 may correspond to data '0011', the thirteenth program state P13 may correspond to data '0010', the fourteenth program state P14 may correspond to data '0001', and the fifteenth program state P15 may correspond to data '0000'. However, the data corresponding to each program state is exemplary and may be modified.

When the program operation is ended, the selected memory cells may have the threshold voltage corresponding to any one of the erase state E and the first to fifteenth program states P1 to P15 as shown in FIG. 8B. The memory device may read data stored in the selected memory cells by performing a read operation using first to fifteenth read voltages R1 to R15.

The first read voltage R1 may be a read voltage that distinguishes between the erase state E and the first program state P1, the second read voltage R2 may be a read voltage that distinguishes between the first program state P1 and the second program state P2, the third read voltage R3 may be a read voltage that distinguishes between the second program state P2 and the third program state P3, the fourth read voltage R4 may be a read voltage that distinguishes between the third program state P3 and the fourth program state P4, the fifth read voltage R5 may be a read voltage that distinguishes between the fourth program state P4 and the fifth program state P5, the sixth read voltage R6 may be a read voltage that distinguishes between the fifth program state P5 and the sixth program state P6, the seventh read voltage R7 may be a read voltage that distinguishes between the sixth program state P6 and the seventh program state P7, the eighth read voltage R8 may be a read voltage that distinguishes between the seventh program state P7 and the eighth program state P8, the ninth read voltage R9 may be a read voltage that distinguishes between the eighth program state P8 and the ninth program state P9, the tenth read voltage R10 may be a read voltage that distinguishes between the ninth program state P9 and the tenth program state P10, the eleventh read voltage R11 may be a read voltage that distinguishes between the tenth program state P10 and the eleventh program state P11, the twelfth read voltage R12 may be a read voltage that distinguishes between the eleventh program state P11 and the twelfth program state P12, the thirteenth read voltage R13 may be a read voltage that distinguishes between the twelfth program state P12 and the thirteenth program state P13, the fourteenth read voltage R14 may be a read voltage that distinguishes between the thirteenth program state P13 and the fourteenth program state P14, and the fifteenth read voltage R15 may be a read voltage that distinguishes between the fourteenth program state P14 and the fifteenth program state P15.

In FIGS. 9A, 9B and subsequent figures, it is assumed that each of the plurality of memory cells is a TLC storing 3-bit of data. However, the scope of the present disclosure is not limited thereto, and each of the plurality of memory cells may be an MLC storing 2-bit of data or a QLC storing 4-bit of data.

FIG. 9A is a table showing a program state verified in a plurality of program loops according to a comparative embodiment of the present disclosure. FIG. 9B is a table showing a program state verified in a plurality of program loops according to an embodiment of the present disclosure.

In FIGS. 9A and 9B, a column in the table indicates a program loop, and a row in the table indicates a program state in which a verify operation is performed in each program loop. In the embodiment of FIGS. 9A and 9B, it is assumed that the program loops are first to twenty-first program loops, and the memory cell in which the program operation is performed is programmed as a TLC.

FIGS. 9A and 9B illustrate the fourteenth to twenty-first program loops among the plurality of program loops and a program state in which the verify operation is performed in each loop.

In the table shown in FIGS. 9A and 9B, mark "0" may mean that the verify operation for a corresponding program state is performed in a corresponding program loop.

In FIG. 9A, verify operations for a second highest program state PV6 and a highest program state PV7 may be performed in the program loops 16 to 19. Here, the highest program state PV7 may be a program state corresponding to a highest threshold voltage distribution among the plurality of program states to which the memory cell is programmed. The second highest program state PV6 may be a program state adjacent to the highest program state PV7.

In the embodiment shown in FIG. 9B, the verify operation only for the second highest program state PV6 may be performed until the nineteenth program loop, and the verify operation only for the highest program state PV7 may be performed from the twentieth program loop after verification for the second highest program state PV6 is passed in the nineteenth program loop.

In FIG. 9B, the verification for the highest program state PV7 may be performed after the program operation for the second highest program state PV6 is completed. According to one embodiment, when a pass signal for the second highest program state PV6 is received from a current sensing circuit 160 (refer to FIG. 14), it may be determined that the program operation for the second highest program state PV6 is completed. In FIG. 9B, the verify operation for the highest program state PV7 is performed in the twentieth program loop, but when the program operation for the second highest program state PV6 is completed in the eighteenth program loop, the verify operation for the highest program state PV7 may be performed in the nineteenth program loop.

In FIG. 9A which is a comparative embodiment of the present disclosure, an amount of time for verification on both of the second highest program state PV6 and the highest program state PV7 is required in the sixteenth to nineteenth program loops. On the other hand, in FIG. 9B which is one embodiment of the present disclosure, since only an amount of time for verification on the second highest program state PV6 is required and the verify operation for the highest program state PV7 is not performed in the sixteenth to nineteenth program loops, and thus the entire program time may be saved.

Figure 10:
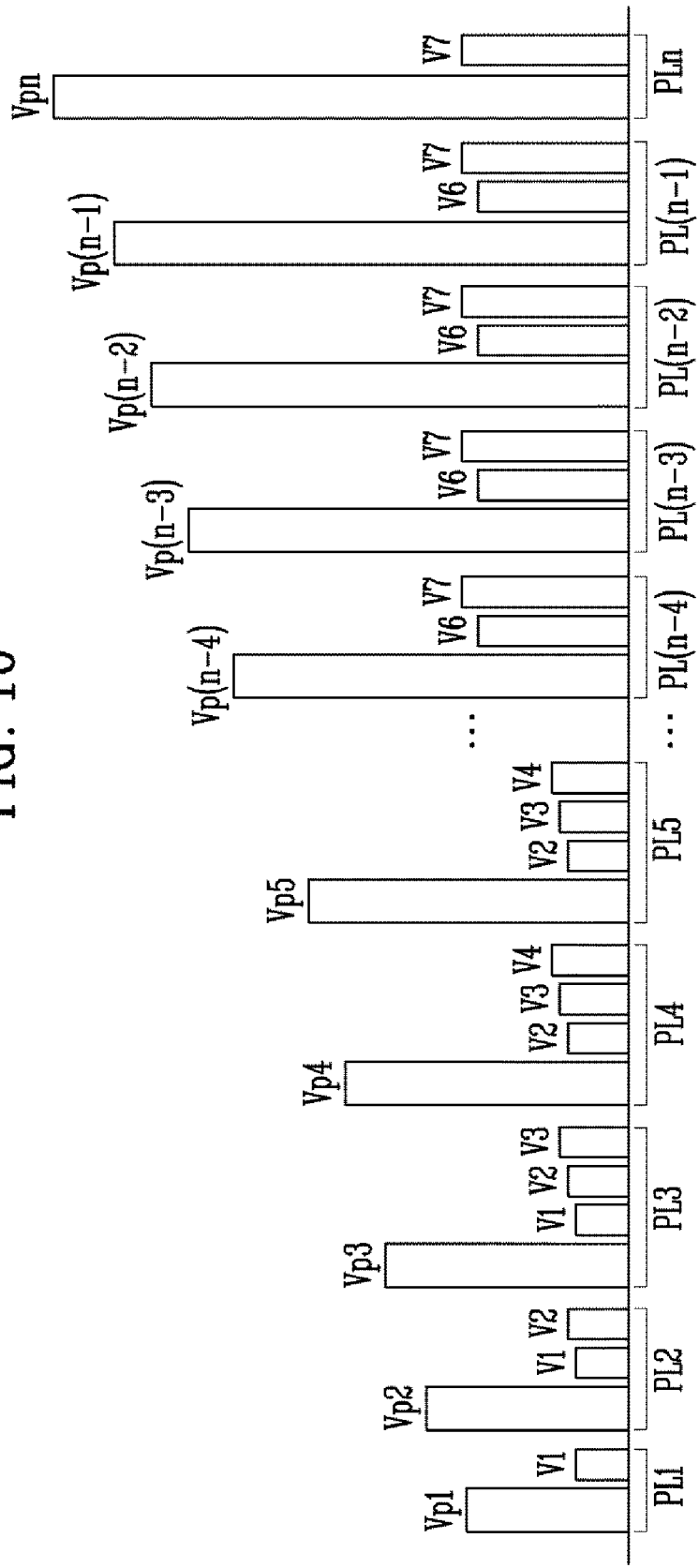
FIG. 10 is a diagram illustrating a program operation corresponding to FIG. 9A.

FIG. 10 is a diagram illustrating a program operation corresponding to FIG. 9A.

The program operation of the memory device may include a plurality of program loops PL1 to PLn. That is, the memory device 100 may perform the plurality of program loops PL1 to PLn to program selected memory cells to have a threshold voltage distribution corresponding to any one of the plurality of program states.

The plurality of program loops PL1 to PLn may include a program voltage apply operation of applying the program voltage and a verify operation of determining whether the memory cells are programmed by applying the verify voltages.

For example, when the third program loop PL3 is performed, first to third verify voltages V1 to V3 are sequentially applied to verify the program state of the plurality of memory cells after a third program voltage Vp3 is applied. Memory cells of which a target program state is the first program state may be verified by the first verify voltage V1, memory cells of which a target program state is the second program state may be verified by the second verify voltage V2, and memory cells of which a target program state is the third program state may be verified by the third verify voltage V3.

The memory cells of which the verification is passed by the verify voltages V1 to V3 may be determined to have the target program state, and thereafter, program may be inhibited for these memory cells in the fourth program loop PL4. In the fourth program loop PL4, a fourth program voltage Vp4, which is higher than the third program voltage Vp3 by a unit voltage, is applied to program the remaining memory cells except for the memory cells on which the program is inhibited. Thereafter, the verify operation may be performed identically to the verify operation of the third program loop PL3. For example, the verification pass may be that a memory cell is read as an off-cell by a corresponding verify voltage.

During the verify operation, the verify voltage may be applied to a selected word line, which is a word line to which the selected memory cells are connected. The page buffer may determine whether the verification of the memory cells is passed based on the voltage or the current flowing through the bit lines respectively connected to the selected memory cells.

When described to correspond to the comparative embodiment of FIG. 9A, PL(n−4) may correspond to the sixteenth program loop, and an (n−4)-th program voltage may correspond to Vp16. The memory cells in which the target program state is the second highest program state may be verified by the sixth verify voltage V6. The memory cells in which the target program state is the highest program state may be verified by the seventh verify voltage V7. The verification by the sixth verify voltage V6 and the verification by the seventh verify voltage V7 may be performed from the sixteenth program loop to PL(n−1) corresponding to the nineteenth program loop.

Figure 11:
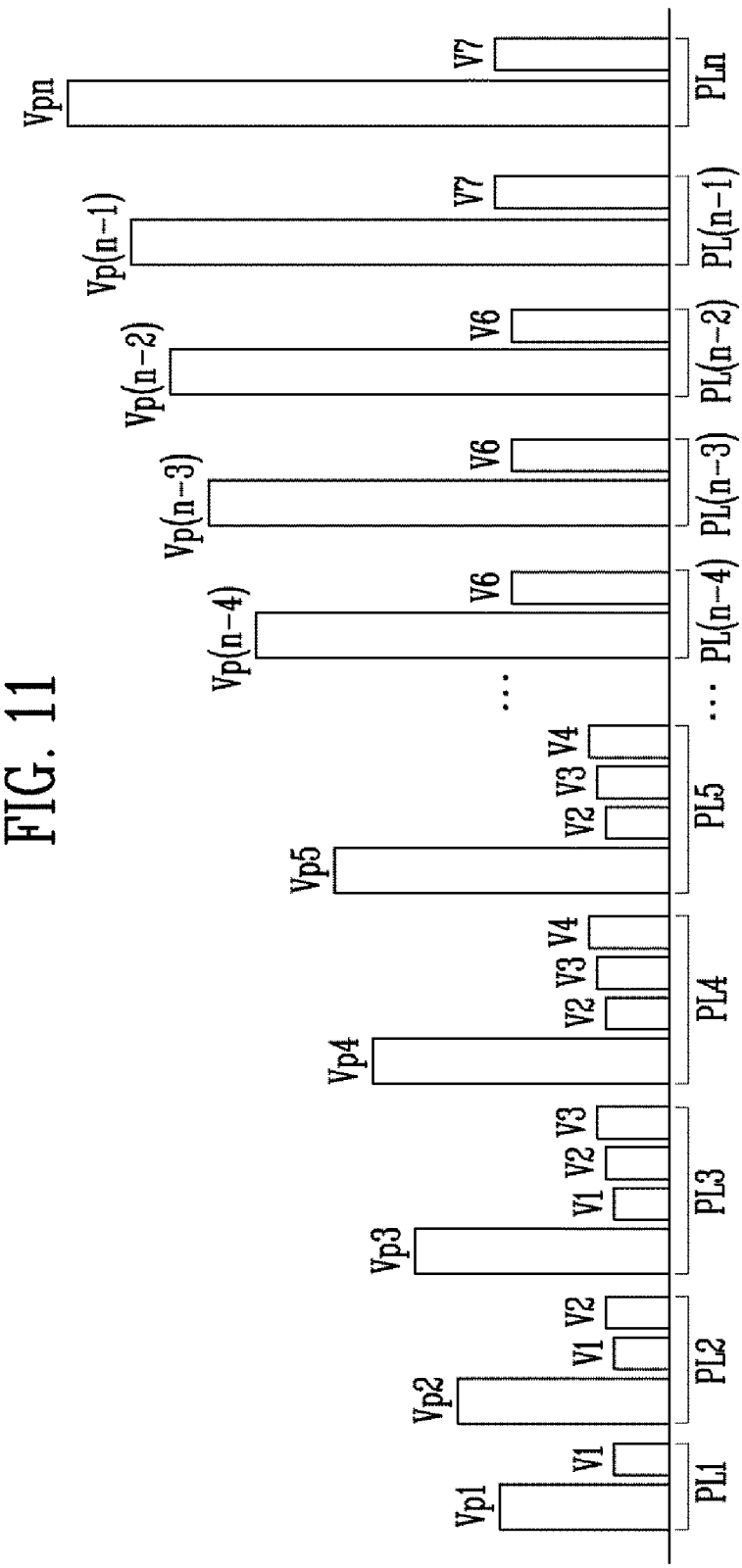
FIG. 11 is a diagram illustrating a program operation corresponding to FIG. 9B.

FIG. 11 is a diagram illustrating a program operation corresponding to FIG. 9B.

In this embodiment, the highest program state may be the program state corresponding to the highest threshold voltage distribution among the plurality of program states, and the second highest program state may be the program state adjacent to the program state corresponding to the highest threshold voltage distribution among the plurality of program states.

In FIG. 11, since 'n' corresponds to 21, 'n−1' may correspond to 20, 'n−2' may correspond to 19, 'n−3' may correspond to 18, and 'n−4' may correspond to 17. In FIG. 11, although not shown, in the sixteenth program loop or less, the verify operation may be performed once in each program loop from the seventeenth program loop to the twenty-first program loop.

Specifically, a program voltage Vp19 may be applied in the nineteenth program loop corresponding to PL(n−2), and the memory cells in which the target program state is the second highest program state may be verified by the sixth verify voltage V6. When the verification is passed in the nineteenth program loop, the memory cells of which the target program state is the highest program state may be verified by the seventh verify voltage V7 from the twentieth program loop corresponding to PL(n−1).

According to one embodiment of the present disclosure, after the verification for the second highest program state is passed in the program loop, the verify operation for the highest program state may be performed. In this embodiment, compared to the comparative embodiment of FIG. 10, since the verify operation for the highest program state may be omitted, the entire program time may be reduced.

Figure 12:
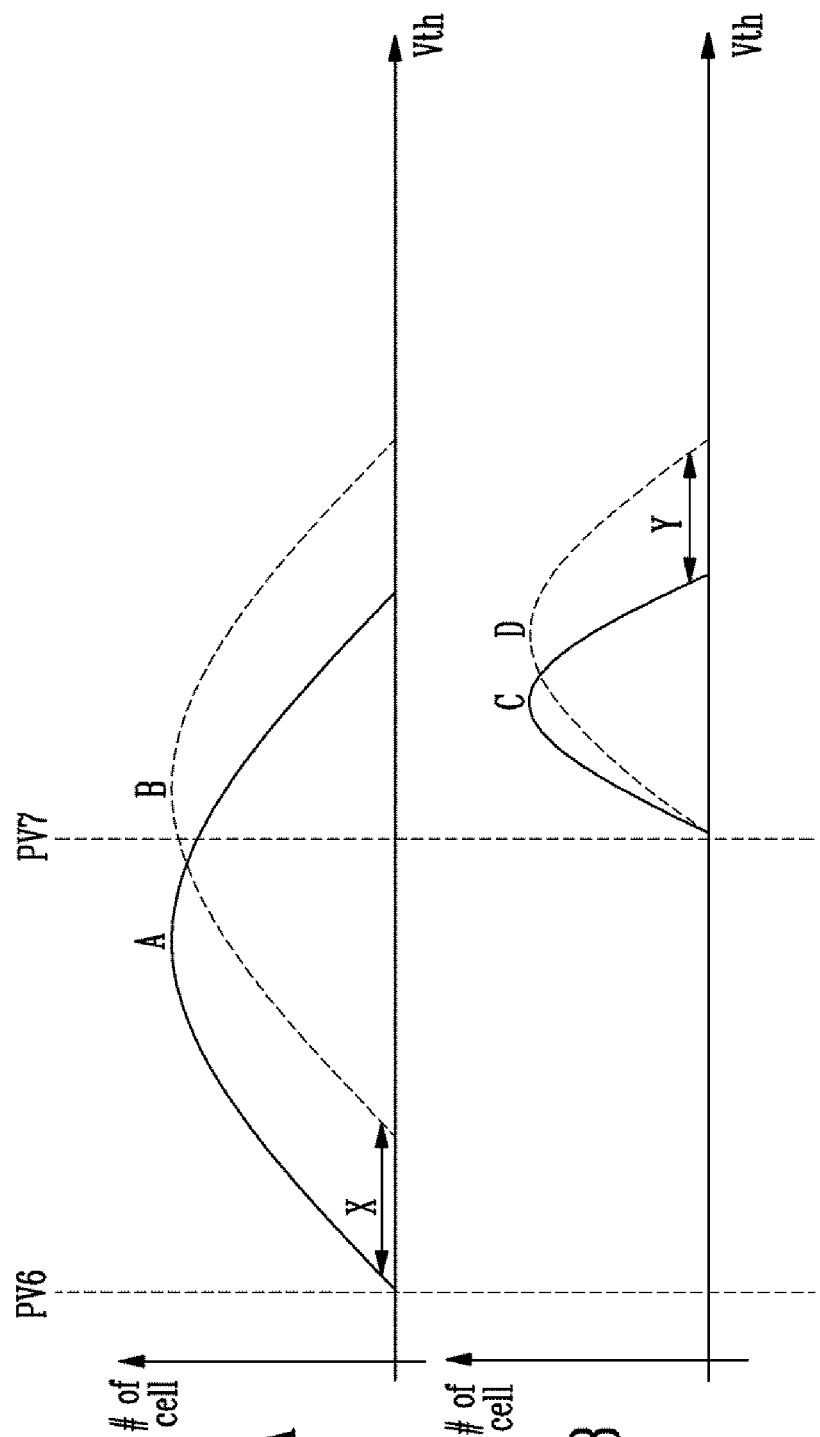
FIGS. 12A and 12B are diagrams illustrating a case in which a threshold voltage distribution corresponding to a highest program state is widened according to an embodiment of the present disclosure.

FIGS. 12A and 12B are diagrams illustrating a case in which a threshold voltage distribution corresponding to the highest program state is widened according to an embodiment of the present disclosure.

A horizontal axis of FIGS. 12A and 12B indicates the threshold voltages of the memory cells, and a vertical axis indicates the number of memory cells. FIG. 12A shows the threshold voltages of the memory cells having the highest program state as the target program state when the verification of the second highest program state is passed according to an embodiment of the present disclosure. FIG. 12A may illustrate the threshold voltages of the memory cells when up to the nineteenth program loop of FIG. 9B is progressed. FIG. 12B shows according to one embodiment the threshold voltages corresponding to the highest program state of the memory cells when up to the last program loop is progressed. FIG. 12B may illustrate the threshold voltages of the memory cells when up to the twenty-first program loop of FIG. 9B is progressed.

When the program operation is performed up to the nineteenth program loop, the threshold voltage distribution of the memory cells having the highest program state as the target program state may be "A". However, since the program voltage is applied until the verification for the second highest program state is passed, the threshold voltage distribution of the memory cells may be "B" which is shifted to right. Here, "X" may mean a changed width of the threshold voltage distribution of the memory cells. When the threshold voltage of the memory cells corresponds to "B", the threshold voltage distribution of the memory cells may be wider than a normal threshold voltage distribution "C" according to a subsequent program operation "D". Here, "Y" may mean an increase width of the threshold voltage distribution of the memory cells on which the program is completed. When the threshold voltage distribution of the memory cells is widened, reliability of the memory device may be reduced, and thus a width of the threshold voltage distribution of the memory cells is maintained in one embodiment. A method of maintaining the width of the threshold voltage distribution of the memory cells by adjusting a program speed of the memory cells is described in detail with reference to FIGS. 13A and 13B.

Figure 13:
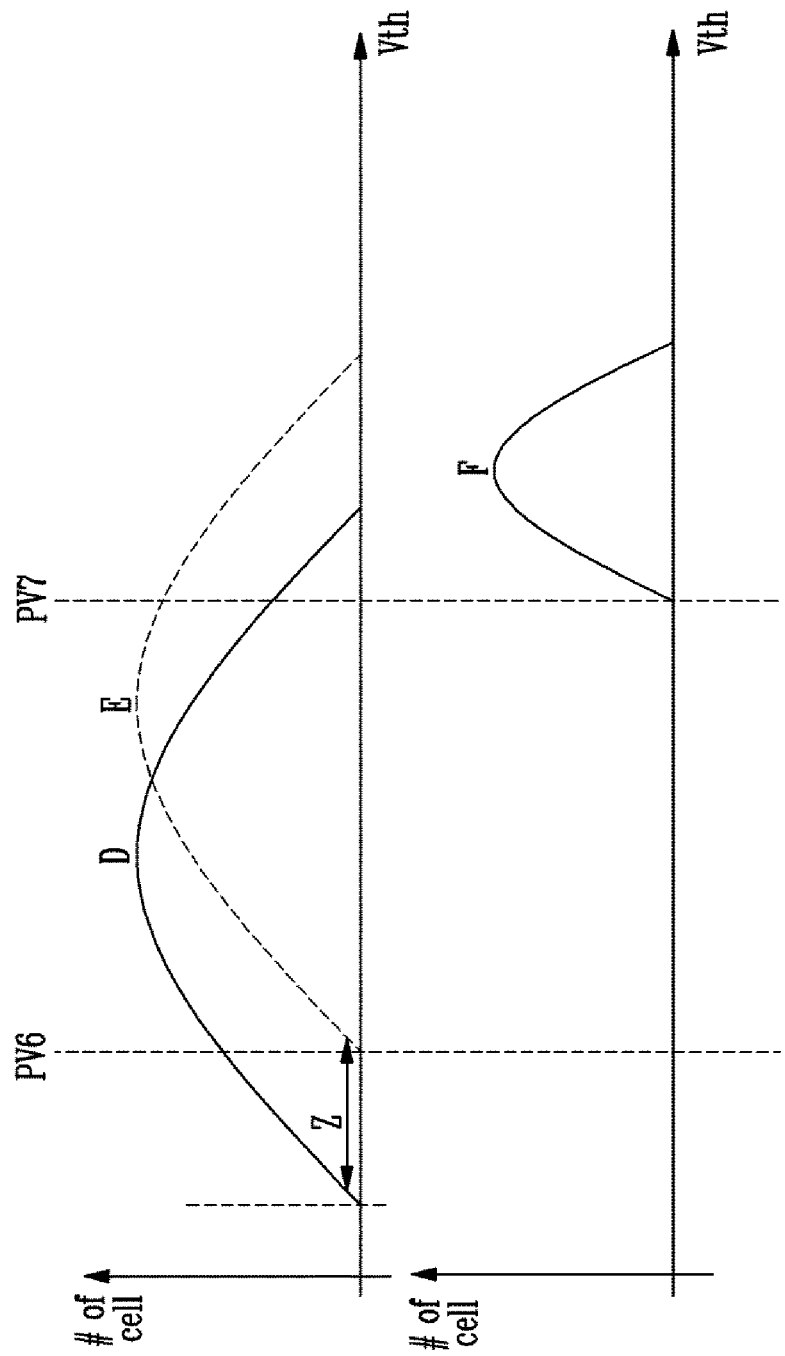
FIGS. 13A and 13B are diagrams illustrating an improved threshold voltage distribution according to an embodiment of the present disclosure.

FIGS. 13A and 13B are diagrams illustrating an improved threshold voltage distribution according to one embodiment of the present disclosure.

A horizontal axis of FIGS. 13A and 13B indicates the threshold voltages of the memory cells, and a vertical axis indicates the number of memory cells. FIG. 13A shows the threshold voltages of the memory cells to which the program control voltage is applied to the bit line of the memory cells having the highest program state as the target program state while the program voltage corresponding to the second highest program state is applied according to one embodiment of the present disclosure. FIG. 13A may illustrate the threshold voltages of the memory cells when up to the nineteenth program loop of FIG. 9B is progressed. FIG. 13B shows the threshold voltages corresponding to the highest program state of the memory cells when up to the last program loop is progressed according to an embodiment of the present disclosure. FIG. 13B may illustrate the threshold voltage of the memory cells when up to the twenty-first program loop of FIG. 9B is progressed.

Specifically, in FIG. 9B, when the program voltage is applied from the fourteenth program loop to the nineteenth program loop, the program control voltage may be applied to the bit line of the memory cells having the highest program state as the target program state. When the program control voltage is applied to the bit line, a program speed of the corresponding memory cells may be reduced. Compared with FIGS. 12A and 12B, the threshold voltage distribution of the memory cells having the highest program state as the target program state may be shifted to a left. "A" of FIG. 12A corresponds to "D" of FIGS. 13A, and B of FIG. 12A corresponds to E of FIG. 13A. Here, "Z" may mean a change width of the threshold voltage distribution of the memory cells. When "Z" of FIG. 13A is wider than "X" of FIG. 12A, the width of the threshold voltage distribution of the memory cells may be maintained.

When the threshold voltages of the memory cells having the highest program state as the target program state are adjusted by controlling the program speed, the width of the threshold voltage distribution of the memory cells having the highest program state as the target program state may be maintained, as shown as "F" of FIG. 13B, even though up to the last program loop is progressed. Therefore, the reliability and operation speed of the memory device may be improved.

According to one embodiment of the present disclosure, whether to apply the program control voltage may be determined according to the program voltage applied to the word line connected to the memory cell. When the program voltage exceeds the predetermined value in a thirteenth program loop (not illustrated in FIGS. 9A and 9B), the program control voltage may be applied in the fourteenth program loop of FIGS. 9A and 9B. When the program voltage is less than the predetermined value until the eighteenth program loop of FIGS. 9A and 9B, the program control voltage may not be applied until the eighteenth program loop.

According to one embodiment of the present disclosure, a magnitude of the program control voltage may vary according to a position of the word line connected to the memory cell. The magnitude of the program control voltage to be applied to a bit line coupled to a memory cell may increase or decrease depending on a location of a word line coupled to the memory cell.

Figure 14:
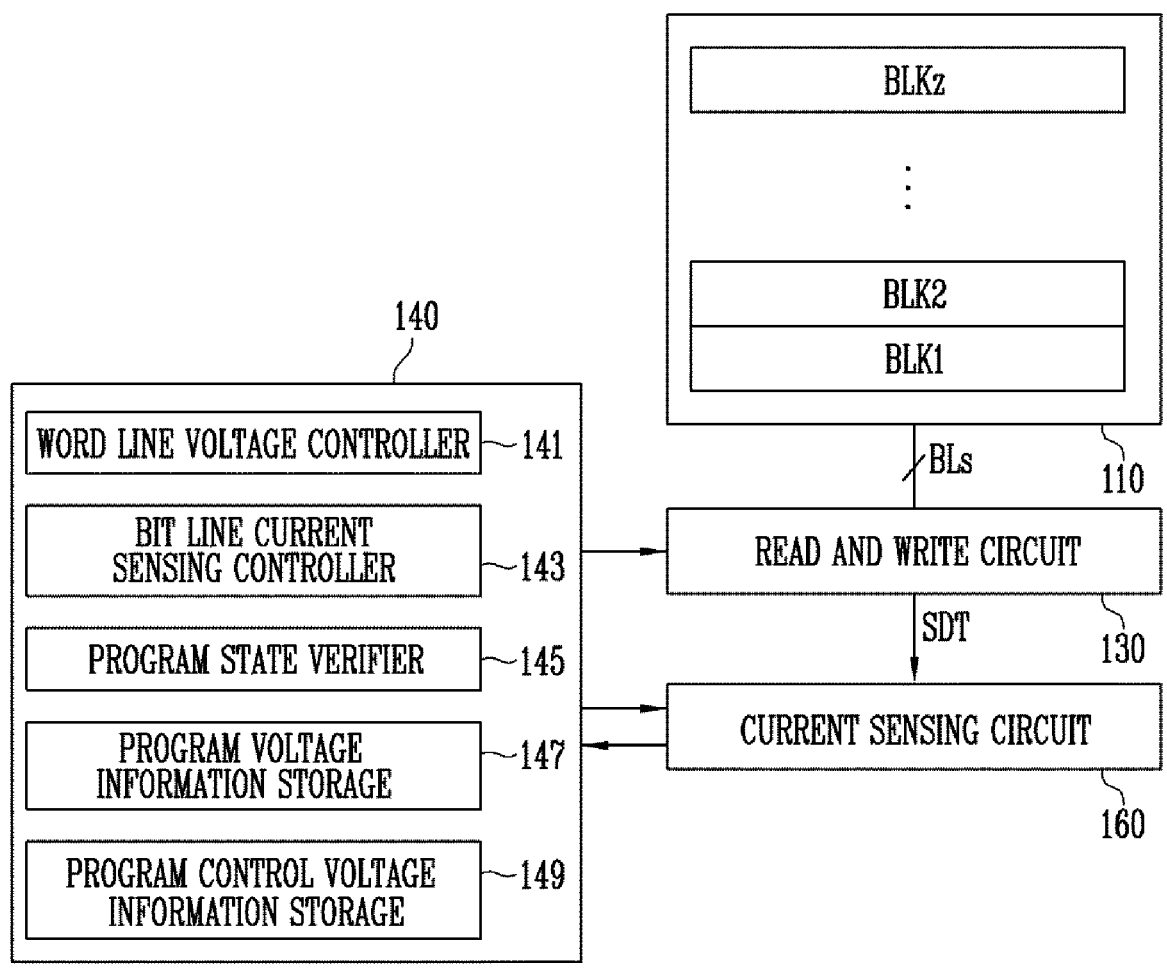
FIG. 14 is a block diagram illustrating a method of performing a program operation according to an embodiment of the present disclosure.

FIG. 14 is a block diagram illustrating a method of performing a program operation according to one embodiment of the present disclosure.

According to this embodiment, the control logic 140 may transmit a control signal to the read and write circuit 130 and the current sensing circuit 160. The memory cell array 110 includes the plurality of memory blocks BLK1 to BLKz. The plurality of memory blocks BLK1 to BLKz are connected to the read and write circuit 130 through the bit lines BL1 to BLm. The plurality of memory blocks BLK1 to BLKz includes a plurality of memory cells.

The read and write circuit 130 includes the plurality of page buffers PB1 to PBm. The plurality of page buffers PB1 to PBm are connected to the memory cell array 110 through the bit lines BL1 to BLm. The plurality of page buffers PB1 to PBm transmit to the current sensing circuit 160 sensing data SDT obtained by sensing a change of an amount of current flowing according to a program state of a corresponding memory cell.

The current sensing circuit 160 may perform a current sensing operation by receiving the sensing data SDT from the read and write circuit 130. The current sensing operation may be an operation of determining whether the memory cells are programmed to the target state and may include an individual current sensing operation and a total current sensing operation.

The current sensing circuit 160 may generate a reference current and a reference voltage in response to a preset permission bit and generate a verify current and a verify voltage according to the sensing data SDT. The current sensing circuit 160 may compare the reference voltage with the verify voltage and transmit a pass signal PS or a fail signal FS to the control logic 140.

In one embodiment of the present disclosure, when the number of memory cells of which the verify operation is failed among the memory cells to be programmed to a target program state is less than or equal to a set number, the current sensing circuit 160 may determine that the verify operation for the selected program state is passed and output the pass signal PS. When the number of memory cells of which the verify operation is failed exceeds the set number, the current sensing circuit 160 may determine that the verify operation for a specific program state is failed and output the fail signal FS.

The control logic 140 may include a word line voltage controller 141, a bit line current sensing controller 143, a program state verifier 145, a program voltage information storage 147, and a program control voltage information storage 149.

The word line voltage controller 141 may control the peripheral circuit to apply the verify voltage to the word line to which the memory cells are commonly connected during the verify operation included in the program loop. The word line voltage controller 141 may control to apply the verify voltage corresponding to any one of the plurality of program states to the word line to which the memory cells are commonly connected.

The bit line current sensing controller 143 may control the current sensing circuit 160 to sense the currents of the bit lines according to the threshold voltage of the memory cells while the verify voltage is applied to the word line of the memory cells. The bit line current sensing controller 143 may transmit information on the preset permission bit so that the current sensing circuit 160 generates the reference current and the reference voltage.

The program state verifier 145 may determine whether the verification for the specific program state is passed based on a result of sensing the bit line currents. The program state verifier 145 may calculate a ratio of the memory cells determined as programmed to the specific program state, among the memory cells, based on a sum of the bit line currents, and control the current sensing circuit 160 to determine that the verification for the specific program state is passed when the calculated ratio exceeds a predetermined value.

The program voltage information storage 147 may include information on a relationship between the program loop and the program voltage. Referring back to FIG. 9B, information indicating that the program voltage corresponding to the sixth program state PV6 is applied from the fourteenth program loop to the nineteenth program loop may be stored in the program voltage information storage 147. Information indicating that the program voltage corresponding to the seventh program state PV7 is applied in the twentieth program loop and the twenty-first program loop may be stored in the program voltage information storage 147.

The program voltage information storage 147 may include information on a relationship between a voltage magnitude and the program voltage. Since a range of a specific program voltage magnitude is determined in advance, the program voltage may be determined according to the applied voltage magnitude.

The program control voltage information storage 149 may include information on a magnitude of the program control voltage corresponding to each of the plurality of word lines included in the memory block. Since the program speed of the memory cell having the highest program state as a target program state is variously controlled according to a location of a word line coupled to the memory cell, different program control voltages may be applied for each word line. The program control voltage according to an embodiment of the present disclosure may be 0.5V.

The program control voltage information storage 149 may include information on the program loop in which the program control voltage is to be applied to a bit line coupled to a memory cell and the magnitude of the program voltage applied to the word line coupled to the memory cell. When the magnitude of the program voltage applied to the word line of the memory cell is less than the predetermined value, the program speed for the memory cell is not required to be controlled, and thus the program control voltage may not be applied to the bit line of the memory cell.

Figure 15:
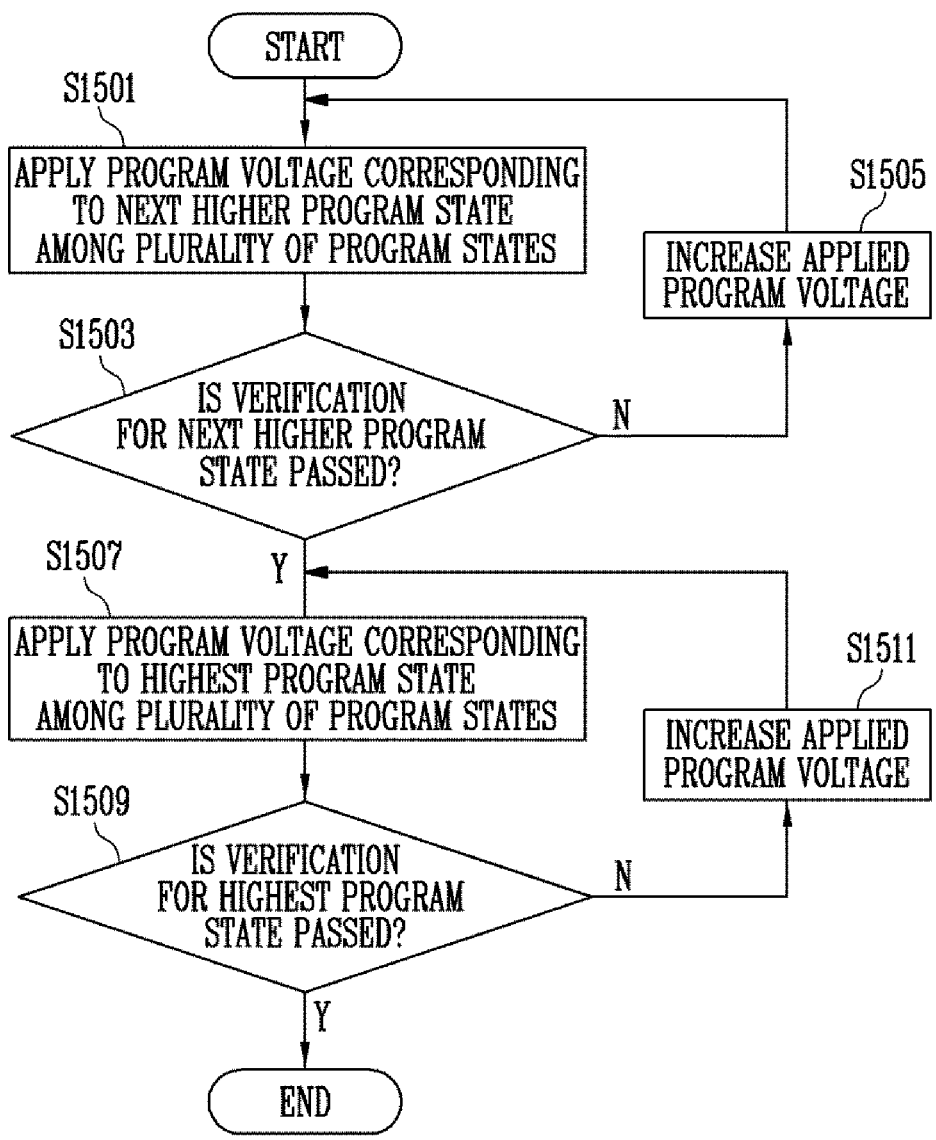
FIG. 15 is a flowchart illustrating a method of operating a memory device according to an embodiment of the present disclosure.

FIG. 15 is a flowchart illustrating a method of operating a memory device according to an embodiment of the present disclosure.

According to one embodiment of the present disclosure, the memory device may apply the program control voltage to the bit line of the memory cell having the highest program state as the target program state among the plurality of program states while the program voltage corresponding to the second highest program state among the plurality of program states is applied to the word line coupled to the memory cell, and may perform the verify operation for the highest program state among the plurality of program states after verification for the second highest program state among the plurality of program states is passed.

Here, the highest program state may be the program state corresponding to the highest threshold voltage distribution among the plurality of program states, and the second highest program state may be the program state adjacent to the highest program state.

Here, the program voltage corresponding to the second highest program state may be the program voltage applied to the word line of the memory cell during the program voltage apply operation of a predetermined program loop among the plurality of program loops. Here, the program voltage corresponding to the second highest program state may be the voltage of a predetermined magnitude of the memory cell included in the memory block. Here, the program voltage corresponding to the second highest program state may be the program voltage allowing the threshold voltages of the memory cells to be included in the threshold voltage distribution corresponding to the program state adjacent to the program state corresponding to the highest threshold voltage distribution among the plurality of program states.

In step S1501, the memory device may apply the program voltage corresponding to the second highest program state among the plurality of program states to the word line of the memory cell. The control logic may apply the program control voltage to the bit line of the memory cells having the highest program state as the target program state among the plurality of program states while the program voltage is applied to the word line to which the memory cells are commonly connected. The control logic may apply different magnitudes of the program control voltage according to the position of the word line of the memory cell.

According to another embodiment of the present disclosure, a control logic included in a memory device that performs a program operation of storing data in memory cells having any one of first to N-th program states as a target program state may apply a program control voltage to a bit line of memory cells having the N-th program state as the target program state while a program voltage corresponding to the (N−1)-th program state is applied to a word line to which memory cells are commonly connected during the program operation.

In step S1503, the control logic may determine whether the verification for the second highest program state among the plurality of program states is passed. The bit line current sensing controller may control the current sensing circuit 160 receiving the sensing data from the read and write circuits connected with the memory cells included in the memory cell array through the bit line. The control logic may receive a verification result for the second highest program state. The program state verifier may control the peripheral circuit to determine whether the verification for the specific program state is passed based on a result of sensing the bit line currents.

When the verification result is a fail, in step S1505, the control logic may increase the program voltage applied to the word line of the memory cells by the unit voltage. The word line voltage controller may control the peripheral circuit to apply the increased program voltage corresponding to the specific program state to the word line to which the memory cells are commonly connected. The control logic may control steps S1501 to S1505 repeatedly by increasing the program voltage.

When the verification result is a pass, in step S1507, the memory device may apply the program voltage corresponding to the highest program state among the plurality of program states to the word line of the memory cell. When the program voltage is applied, the threshold voltage of the memory cell may be increased and may be included in the threshold voltage distribution corresponding to the target program state.

In step S1509, the control logic may determine whether the verification for the highest program state among the plurality of program states is passed. Similarly to step S1503, the verification result may be received from the current sensing circuit.

When the verification result is a fail, in step S1511, the control logic 140 may increase the program voltage applied to the word line of the memory cells by the unit voltage. Step S1511 may correspond to step S1505.

When the verification result is a pass, the verification may be completed up to the highest program state, and a program procedure may be ended.

According to another embodiment of the present disclosure, the control logic included in the memory device that performs the program operation of storing data in the memory cells each having any one of the first to N-th program states as the target program state may perform verification for the N-th program state during the verify operation included in the (n+1)-th program loop among the plurality of program loops (S1509), when the verification for the (N−1)-th program state is passed during the verify operation included in the n-th program loop among the plurality of program loops (S1503).

Figure 16:
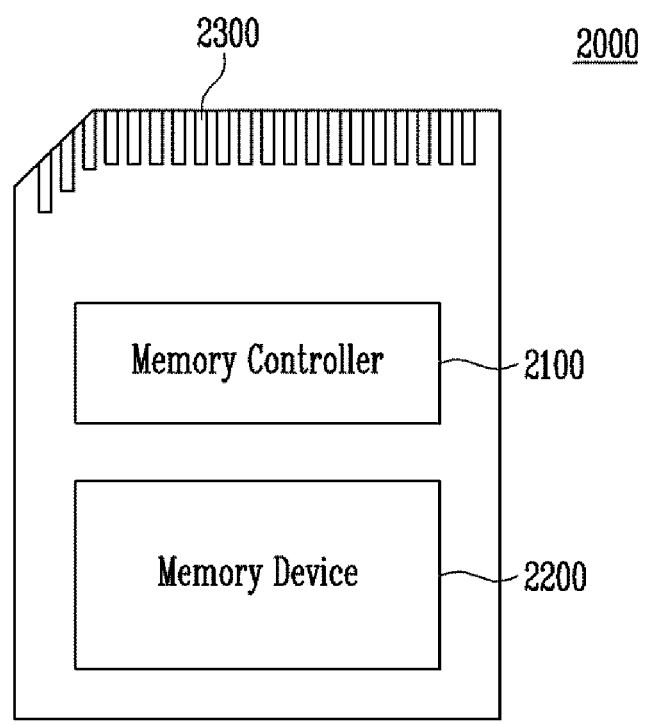
FIG. 16 is a block diagram illustrating a memory card system to which a storage device according to an embodiment of the present disclosure is applied.

FIG. 16 is a block diagram illustrating a memory card system to which a storage device according to one embodiment of the present disclosure is applied.

Referring to FIG. 16, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, program, erase, and background operations of the memory device 2200. The memory controller 2100 is configured to provide an interface between the memory device 2200 and a host. The memory controller 2100 is configured to drive instructions or firmware for controlling the memory device 2200. The memory controller 2100 may be implemented identically to the memory controller 200 described with reference to FIG. 1.

For example, the memory controller 2100 may include components such as for example a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as for example a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory elements such as for example an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

In one embodiment, the memory controller 2100 and the memory device 2200 may be integrated into one semiconductor device to configure a memory card. For example, the memory controller 2100 and the memory device 2200 may be integrated into one semiconductor device to configure a memory card such as for example a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 17:
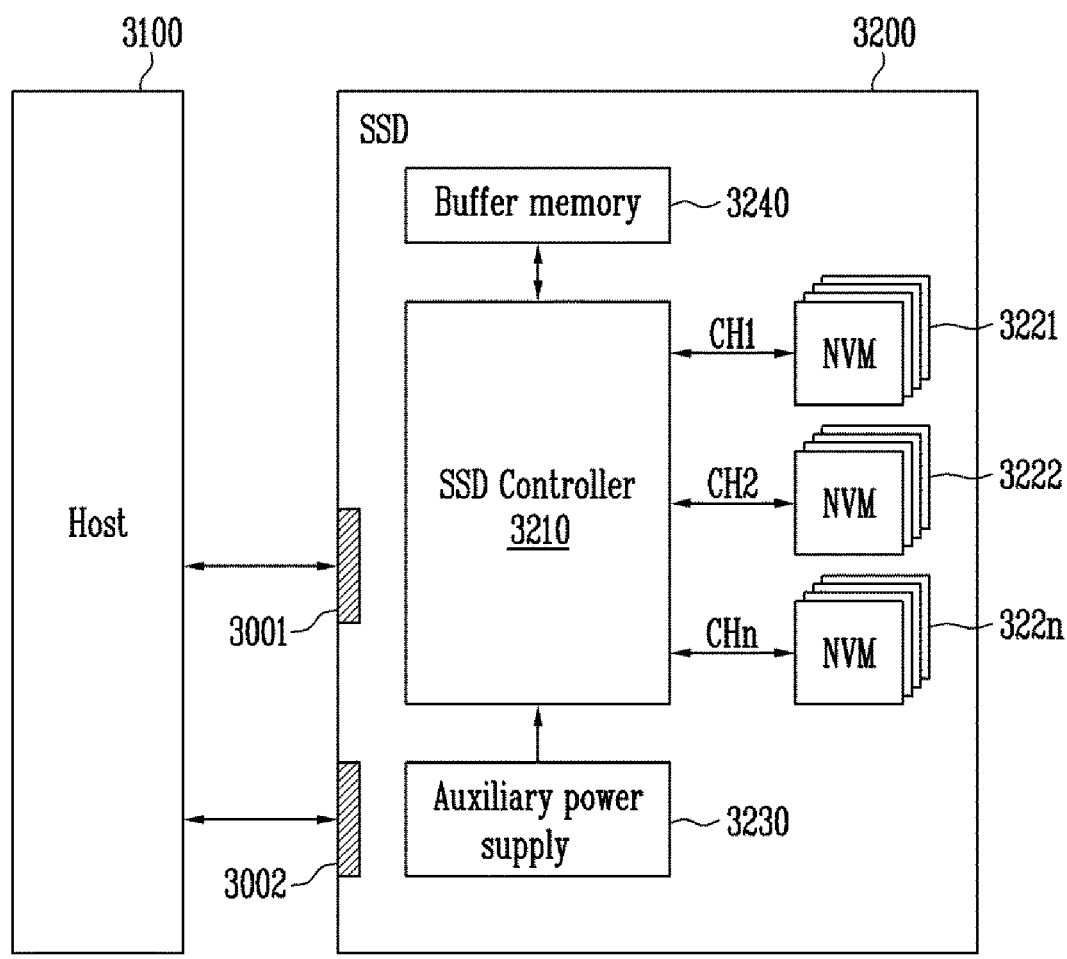
FIG. 17 is a block diagram illustrating a solid state drive (SSD) system to which a storage device according to an embodiment of the present disclosure is applied.

FIG. 17 is a block diagram illustrating a solid state drive (SSD) system to which a storage device according to an embodiment of the present disclosure is applied.

Referring to FIG. 17, the SSD system 3000 includes a host 3100 and an SSD 3200. The SSD 3200 exchanges a signal with the host 3100 through a signal connector 3001 and receives power through a power connector 3002. The SSD 3200 includes an SSD controller 3210, a plurality of flash memories 3221 to 322n, an auxiliary power supply 3230, and a buffer memory 3240.

According to one embodiment of the present disclosure, the SSD controller 3210 may perform the function of the memory controller 200 described with reference to FIG. 1.

The SSD controller 3210 may control the plurality of flash memories 3221 to 322n in response to the signal received from the host 3100. For example, the signal may be signals based on an interface between the host 3100 and the SSD 3200. For example, the signal may be a signal defined by at least one of interfaces such as for example a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as for example a DRAM, an SDRAM, a DDR SDRAM, an LPDDR SDRAM, and a GRAM, or a nonvolatile memory such as an FRAM, a ReRAM, an STT-MRAM, and a PRAM.

Figure 18:
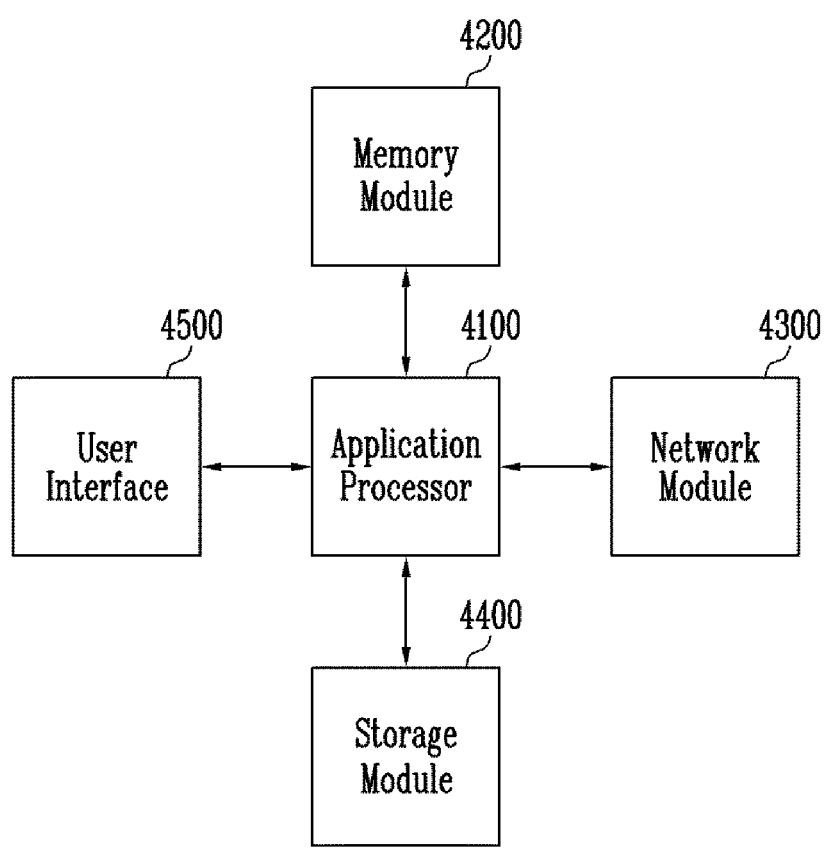
FIG. 18 is a block diagram illustrating a user system to which a storage device according to an embodiment of the present disclosure is applied.

FIG. 18 is a block diagram illustrating a user system to which the storage device according to one embodiment of the present disclosure is applied.

Referring to FIG. 18, the user system 4000 includes an application processor 4100, a memory module 4200, a network module 4300, a storage module 4400, and a user interface 4500.

The application processor 4100 may drive components such as for example an operating system (OS), a user program, or the like included in the user system 4000. The application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as for example a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. The application processor 4100 and memory module 4200 may be packaged based on a package on package (POP) and provided as one semiconductor package.

The network module 4300 may communicate with external devices. For example, the network module 4300 may support wireless communication such as for example code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. The network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. The storage module 4400 may be implemented with a nonvolatile memory element such as for example a phase-change RAM (PRAM), a magnetic RAM (MRAM), a resistive RAM (RRAM), a NAND flash, a NOR flash, and a three-dimensional NAND flash. The storage module 4400 may be provided as a removable storage device (removable drive), such as a memory card, and may be provided as an external drive of the user system 4000.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as for example a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as for example a liquid crystal display (LCD), an organic light emitting diode (OLED) display device, an active matrix OLED (AMOLED) display device, an LED, a speaker, and a monitor.

What is claimed is:

1. A memory device comprising:
   a memory block including memory cells;
   a peripheral circuit configured to perform a program operation of increasing threshold voltages of the memory cells so that the threshold voltages of the memory cells are included in a threshold voltage distribution corresponding to target program states determined according to data to be stored in the memory cells among a plurality of program states; and
   a control logic configured to control the peripheral circuit to perform the program operation,
   wherein the program operation includes a plurality of program loops,
   wherein each of the plurality of program loops includes a program voltage apply operation and a verify operation, and
   wherein the control logic controls the peripheral circuit to perform verification on a highest program state during a verify operation included in a next program loop of any one program loop among the plurality of program loops when verification on a second highest program state among the plurality of program states is determined as passed during a verify operation included in the any one program loop.

2. The memory device of claim 1, wherein the second highest program state is a program state adjacent to the highest program state.

3. The memory device of claim 1, wherein the highest program state is a highest one of the plurality of program states.

4. The memory device of claim 1, wherein the control logic comprises:
   a word line voltage controller configured to control the peripheral circuit to apply a verify voltage corresponding to the second highest program state to a word line to which the memory cells are commonly connected, during the verify operation included in the any one program loop;
   a bit line current sensing controller configured to control the peripheral circuits to sense each of currents of bit lines according to the threshold voltage of the memory cells while the verify voltage corresponding to the second highest program state is applied; and
   a program state verifier configured to determine whether the verification on the second highest program state is passed based on a result of the sensing of the currents of bit lines during the verify operation included in the any one program loop.

5. The memory device of claim 4,
   wherein the program state verifier is further configured to calculate a ratio of memory cells determined as programmed to the second highest program state based on a sum of the currents of bit lines, and
   wherein the program state verifier determines the verification on the second highest program state as passed when the calculated ratio exceeds a predetermined value.

6. The memory device of claim 1, wherein the control logic controls the peripheral circuit further to apply a program control voltage to a bit line of a memory cell having the highest program state as a target program state while applying a program voltage corresponding to the second highest program state to a word line to which the memory cells are commonly connected during the program operation.

7. The memory device of claim 6, wherein the control logic controls the peripheral circuit to vary a magnitude of the program control voltage according to a position of the word line.

8. The memory device of claim 6, wherein the control logic controls the peripheral circuit to apply the program control voltage when a magnitude of the program voltage applied to the word line exceeds a predetermined value.

9. A memory device comprising:
a memory block including memory cells;
a peripheral circuit configured to perform a program operation of increasing threshold voltages of the memory cells so that the threshold voltages of the memory cells are included in a threshold voltage distribution corresponding to target program states determined according to data to be stored in the memory cells among a plurality of program states; and
a control logic configured to control the peripheral circuit to apply a program control voltage to bit lines of memory cells having a highest program state as a target program state among the plurality of program states while applying a program voltage corresponding to a second highest program state among the plurality of program states to a word line to which the memory cells are commonly connected during the program operation.

10. The memory device of claim 9,
wherein the program operation includes a plurality of program loops, and
wherein each of the plurality of program loops includes a program voltage apply operation and a verify operation.

11. The memory device of claim 10, wherein the control logic controls the peripheral circuit to apply the program voltage corresponding to the second highest program state during a program voltage apply operation of a predetermined program loop among the plurality of program loops.

12. The memory device of claim 11, wherein the control logic includes a program voltage information storage including information on a relationship between a program loop and a program voltage.

13. The memory device of claim 10, wherein the program voltage corresponding to the second highest program state has a predetermined magnitude according to the memory cells included in the memory block.

14. The memory device of claim 13, wherein the control logic includes a program voltage information storage including information on a relationship between a voltage magnitude and a program voltage.

15. The memory device of claim 10, wherein the control logic controls the peripheral circuit to apply the program voltage corresponding to the second highest program state during a program voltage apply operation so that the memory cells are programmed to a program state adjacent to the highest program state.

16. The memory device of claim 9, wherein the control logic controls the peripheral circuit to vary a magnitude of the program control voltage according to a position of the word line.

17. The memory device of claim 16, wherein the control logic includes a program control voltage information storage including information on a magnitude of a program control voltage for each of a plurality of word lines included in the memory block.

18. The memory device of claim 9, wherein the control logic controls the peripheral circuit to apply the program control voltage when a magnitude of the program voltage applied to the word line exceeds a predetermined value.

19. The memory device of claim 10, wherein the control logic controls the peripheral circuit further to perform verification on the highest program state during a verify operation included in a next program loop of any one program loop among the plurality of program loops when verification on the second highest program state is passed during a verify operation included in the any one program loop.

20. A memory device that performs a program operation of storing data in memory cells each having any one state among first to N-th program states as a target program state, the memory device comprising:
a memory block including the memory cells;
a peripheral circuit configured to perform the program operation including a plurality of program loops each including a program voltage apply operation and a verify operation; and
a control logic configured to control the peripheral circuit to perform the program operation,
wherein the control logic is further configured to:
perform verification on an N-th program state during a verify operation included in an (n+1)-th program loop among the plurality of program loops when verification on an (N−1)-th program state is passed during a verify operation included in an n-th program loop among the plurality of program loops, and
apply a program control voltage to a bit line of a memory cell having the N-th program state as a target program state while applying a program voltage corresponding to the (N−1)-th program state to a word line to which the memory cells are commonly connected during a program voltage apply operation included in the n-th program loop.

* * * * *